United States Patent [19]

Kawakami et al.

[11] Patent Number: 5,195,238
[45] Date of Patent: Mar. 23, 1993

[54] METHOD OF MANUFACTURING A PRINTED CIRCUIT BOARD

[75] Inventors: Shin Kawakami; Hirotaka Okonogi; Katsutomo Nikaido; Junichi Ichikawa; Yoshio Nishiyama, all of Iruma, Japan

[73] Assignee: Nippon CMK Corp., Japan

[21] Appl. No.: 841,196

[22] Filed: Feb. 24, 1992

Related U.S. Application Data

[63] Continuation of Ser. No. 674,681, Mar. 22, 1991, abandoned.

[30] Foreign Application Priority Data

Jul. 20, 1990 [JP] Japan .................................. 2-191977

[51] Int. Cl.⁵ .............................................. H05K 3/22
[52] U.S. Cl. ...................................................... 29/846
[58] Field of Search ................................ 29/846–848, 29/852; 156/51, 630, 631, 632, 633, 634

[56] References Cited

U.S. PATENT DOCUMENTS

| 4,528,064 | 7/1985 | Ohsawa et al. | 29/852 X |
| 4,604,799 | 8/1986 | Gurol | 29/852 X |
| 4,766,268 | 8/1988 | Uggowitzer | 29/846 X |
| 4,926,007 | 5/1990 | Aufderheide et al. | 156/51 |

FOREIGN PATENT DOCUMENTS 29276  7/1980  Japan .
22885  5/1990  Japan .

Primary Examiner—Joseph M. Gorski
Assistant Examiner—Peter Dungba Vo
Attorney, Agent, or Firm—Bruce L. Adams; Van C. Wilks

[57] ABSTRACT

A method of manufacturing a printed circuit board comprises the steps of providing an insulating substrate for the printed circuit board, forming circuit patterns made of a conductive material on at least one side of the insulating substrate, forming an insulating layer on the circuit patterns, and adhering a cross-mesh shield layer onto at least a portion of the insulating layer in such a manner that a margin is placed both on the outer periphery of the insulating layer itself and around electric contacts such as lands and through-holes.

5 Claims, 1 Drawing Sheet

METHOD OF MANUFACTURING A PRINTED CIRCUIT BOARD

This is a continuation application of parent application Ser. No. 674,681 filed Mar. 22, 1991 now abandoned.

BACKGROUND OF THE INVENTION

The present invention relates to a method of manufacturing a printed circuit board having circuit patterns formed on one or both sides of an insulating substrate of the board and a shield layer overlaid on the circuit patterns.

As an example of a method of manufacturing a printed circuit board, there is known a method of manufacturing a printed circuit board having a shield layer formed on an overlaid insulating layer in order to shield circuit patterns formed on one or two sides of an insulating substrate of the board from electromagnetic noise coming from other circuit patterns also formed on the board or from external instruments. Such a conventional method is disclosed for example in Japanese Patent Publication No. 29276/1980.

As shown in FIG. 2, a printed circuit board manufactured by such a conventional method comprises an insulating layer 4 adhered onto a required part of a circuit pattern 2 formed on one side of an insulating substrate 1 by use of conductive material, a shield layer 5 adhered to a junction land 3 to maintain an electrical connection with a grounding circuit through the junction land 3, and a protecting film 6 formed to protect the shield layer 5.

Japanese Patent Publication No. 22885/1990 discloses another method of manufacturing a printed circuit board. As shown in FIG. 3, a printed circuit board manufactured by this method has a cross-mesh shield layer 10 formed in place of the shield layer 5 of prescribed thickness shown in FIG. 2.

When a cross-mesh shield layer 10 is formed according to the conventional method of manufacturing a printed circuit board, copper paste is applied by silk-screen printing. This method has a drawback, however, in that the outer periphery of the shield layer 10 or that of lands 7 and 8 are formed as a discontinuous portion, as shown in FIG. 3. As a result, the ability to shield against noise from electromagnetic waves is deteriorated in these discontinuous regions. Furthermore, when forming the shield layer 10, copper paste oozes from the outer periphery to the inside of the lands 7 and 8, and causes additional defects.

SUMMARY OF THE INVENTION

An object of the present invention is to eliminate the above disadvantage in the conventional method of manufacturing a printed circuit board.

Another object of the present invention is to provide a method for manufacturing a printed circuit board which takes full advantage of the desired effects of a cross-mesh shield layer.

A further object of the invention is to prevent the oozing of copper paste from occurring at electric contacts such as through-holes and lands when the shield layer is formed.

According to the present invention, there is provided a method of manufacturing a printed circuit board which comprises an insulating substrate, circuit patterns made of a conductive material on one or both sides of the insulating substrate, an insulating layer formed on the circuit patterns, and a cross-mesh shield layer adhered onto the whole or a required part of the insulating layer in such a manner that a margin is placed both on the outer periphery of the insulating layer itself and around electric contacts such as lands and through-holes.

According to the present invention, the action and effect intrinsic to the cross-mesh shield layer can be fully obtained. Furthermore, the formation of a cross-mesh shield layer in such a manner that a margin is placed both on the outer periphery of the insulating layer itself and around electric contacts such as lands prevents the deterioration of noise prevention. This deterioration is often experienced in discontinuous outer peripheral edges of cross-mesh shield layers or in the periphery of electrical contacts such as lands. Thus, in accordance with the present invention a noise-prevention effect is provided that is to that of shield layers formed with a required thickness in the conventional method.

Furthermore, margining of the periphery of electrical contacts such as lands prevents conductive paste used to form the shield layer from oozing onto electrical contacts such as lands.

These objects and other objects, features, aspects, and advantages of the present invention will become more apparent from the following detailed description of the present invention when taken in conjunction with the accompanying drawings.

DETAILED EXPLANATION OF THE PREFERRED EMBODIMENT

Figure 1:
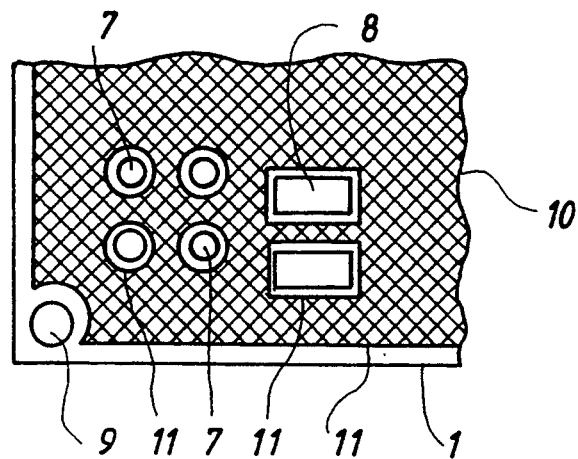
FIG. 1 is an illustration showing a method of manufacturing a printed circuit board of the present invention.
Figure 2:
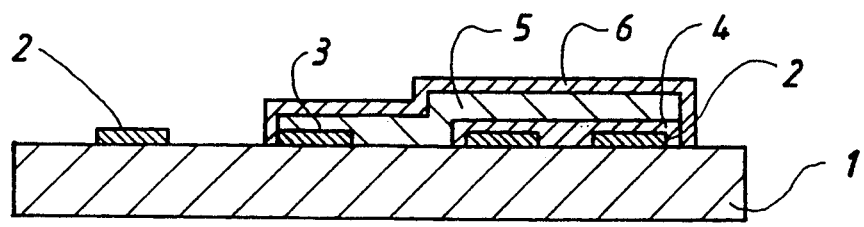
FIGS. 2 and 3 are illustrations showing the conventional methods of manufacturing a printed circuit board.
Figure 3:
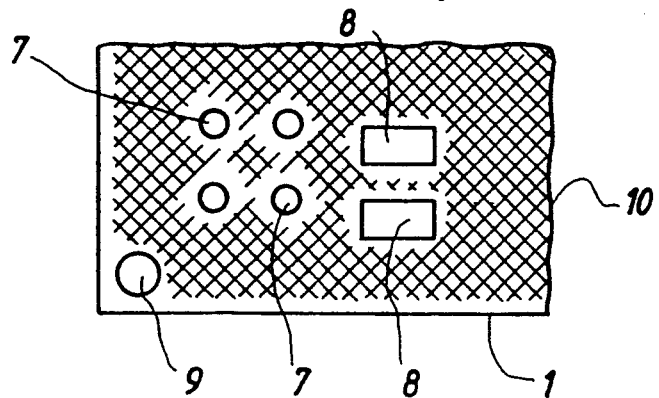

FIG. 1 is an illustration showing a method of manufacturing a printed circuit board in accordance with an embodiment of the present invention.

Referring to FIG. 1, a circuit pattern (not shown) composed of conductive material is formed on one side of an insulating substrate 1 by means of a conventional method of the prior art.

After formation of the circuit pattern, an insulating layer (not shown) is adhered on the circuit pattern except on junction lands (not shown) connected to a grounding circuit and except on other electric contacts such as through-holes (not shown) and lands 7 and 8.

Then, a cross-mesh shield layer 10 is adhered to the insulating layer while margining (11) the peripheral edge of the shield layer 10 and the peripheries of the lands 7 and 8.

The shield layer 10 is formed by being connected to the junction land of the grounding circuit (not shown). Such a connection can be achieved by means of a conventional method, as by adhering and hardening copper paste using silk-screen printing.

Although FIG. 1 shows the shield only partially adhered, it is possible to shield not only a required part but the whole surface of the circuit pattern in the printed circuit board. Moreover, adhering is not limited to a one-sided printed circuit board but also to a double-sided printed circuit board.

In place of the cross-mesh shield layer 10, the same type of shield layer can also be used.

The reference numeral 9 shows a mounting hole in the printed circuit board.

What is claimed is:

1. A method of manufacturing a printed circuit board, comprising the steps of: providing an insulating substrate for said printed circuit board, forming circuit patterns made of a conductive material on at least one side of said insulating substrate, forming an insulating layer on said circuit patterns, and adhering a cross-mesh shield layer having inner and outer edges onto at least a portion of said insulating layer in such a manner that said outer edge of said cross-mesh shield layer defines a continuous margin line along an outer periphery of said insulating layer and said inner edges of said cross-mesh shield layer define continuous margins around electric contacts including lands and throughholes.

2. A method of manufacturing a printed circuit board according to claim 1; wherein the cross-mesh shield layer is formed by silk-screening.

3. A method of manufacturing a printed circuit board, comprising the steps of: providing an insulating substrate; forming a circuit pattern on the insulating substrate; forming an insulating layer on the circuit pattern; and forming a cross-mesh shield layer on at least a portion of the insulating layer, said cross-mesh shield layer having a continuous edge marginally disposed at least along an outer periphery of the insulating layer, thereby defining continuous marginal outer peripheral edges of the cross-mesh shield layer and said insulating layer formed on the circuit board.

4. A method of manufacturing a printed circuit board according to claim 3; wherein the step of forming the cross-mesh shield layer includes forming the cross-mesh shield layer on the insulating layer having a continuous edge marginally disposed along a periphery of electrical contacts to define continuous marginal edges of said cross-mesh layer and said electrical contacts.

5. A method of manufacturing a printed circuit board according to claim 4; wherein the cross-mesh shield layer is formed by silk-screening.

* * * * *